(12) United States Patent
Chen

(10) Patent No.: US 12,300,713 B2
(45) Date of Patent: *May 13, 2025

(54) IMAGE SENSOR HAVING LENS LAYER OVER OPTICAL SENSING AREA AND MANUFACTURING METHOD THEREOF

(71) Applicant: Taiwan Semiconductor Manufacturing Company, Ltd., Hsinchu (TW)

(72) Inventor: Chia-Chan Chen, Hsinchu County (TW)

(73) Assignee: Taiwan Semiconductor Manufactoring Company, Ltd., Hsinchu (TW)

( * ) Notice: Subject to any disclaimer, the term of this patent is extended or adjusted under 35 U.S.C. 154(b) by 29 days.

This patent is subject to a terminal disclaimer.

(21) Appl. No.: 17/830,356

(22) Filed: Jun. 2, 2022

(65) Prior Publication Data

US 2022/0293665 A1    Sep. 15, 2022

Related U.S. Application Data

(63) Continuation of application No. 16/742,930, filed on Jan. 15, 2020, now Pat. No. 11,380,729.

(51) Int. Cl.
*H01L 27/146* (2006.01)

(52) U.S. Cl.
CPC .. *H01L 27/14685* (2013.01); *H01L 27/14627* (2013.01)

(58) Field of Classification Search
CPC ......... H01L 27/14625; H01L 27/14627; H01L 27/1463; H01L 27/1464; H01L 27/14643; H01L 27/14685; H01L 27/14689
See application file for complete search history.

(56) References Cited

U.S. PATENT DOCUMENTS

| | | | |
|---|---|---|---|
| 11,380,729 B2 * | 7/2022 | Chen | H01L 27/1463 |
| 2004/0005729 A1 | 1/2004 | Abe et al. | |
| 2011/0316002 A1 | 12/2011 | Ahn et al. | |
| 2021/0225907 A1 * | 7/2021 | Maruyama | H01L 27/1464 |

FOREIGN PATENT DOCUMENTS

| | | |
|---|---|---|
| CN | 103456749 | 12/2013 |
| KR | 100720467 | 5/2007 |
| KR | 20110077902 | 7/2011 |

OTHER PUBLICATIONS

"Notice of allowance of China Counterpart Application", issued on Feb. 19, 2025, p. 1-p. 5.

* cited by examiner

*Primary Examiner* — Nelson Garces
(74) *Attorney, Agent, or Firm* — JCIPRNET

(57) ABSTRACT

A method includes at least the following steps. A material layer is formed over an image capture chip. A patterned mask layer is formed on the material layer, wherein a pattern density of the patterned mask layer varies from a central region of the patterned mask layer to a periphery region of the patterned mask layer. The material layer is polished by using the patterned mask layer as a mask to form a lens layer including a single lens portion on the image capture chip.

20 Claims, 19 Drawing Sheets

IMAGE SENSOR HAVING LENS LAYER OVER OPTICAL SENSING AREA AND MANUFACTURING METHOD THEREOF

CROSS-REFERENCE TO RELATED APPLICATION

This application is a continuation application of and claims the priority benefit of a prior application Ser. No. 16/742,930, filed on Jan. 15, 2020, now allowed. The entirety of the above-mentioned patent application is hereby incorporated by reference herein and made a part of this specification.

BACKGROUND

Integrated circuits (ICs) with image sensors are used in a wide range of modern day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD sensors, a CMOS image sensor has many advantages such as low voltage operation, low power consumption, compatibility with logic circuitry, random access, and low cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
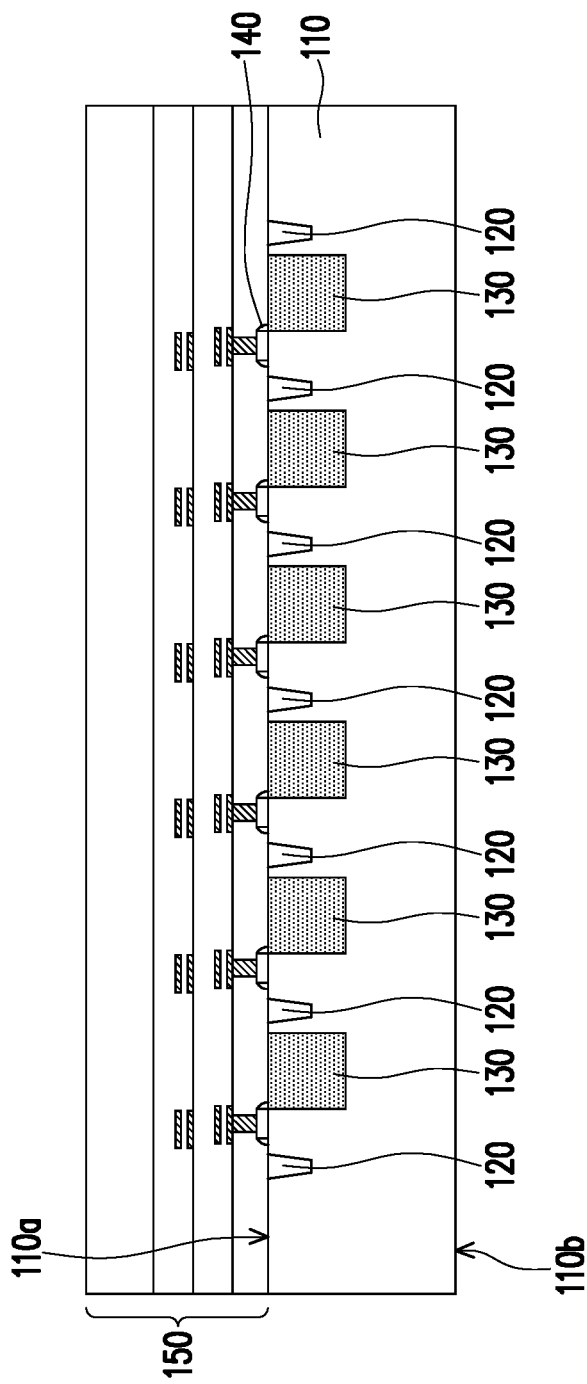
FIG. 1 through FIG. 4 and FIG. 6 through FIG. 8 are schematic cross-sectional views illustrating various stages in a manufacturing method of an image sensor according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 4 and FIG. 6 through FIG. 8 are schematic cross-sectional views illustrating various stages in a manufacturing method of an image sensor according to some embodiments of the present disclosure. The image sensor may be, for example, a CMOS image sensor, and/or an integrated circuit (IC) die or chip.

Referring to FIG. 1, a semiconductor substrate 110 is provided, and a plurality of isolation structures 120 are formed in the semiconductor substrate 110 so as to define a plurality of active regions in the semiconductor substrate 110. Specifically, the semiconductor substrate 110 has a first surface 110a and a second surface 110b opposite to the first surface 110a. The plurality of isolation structures 120 extend from the first surface 110a of the semiconductor substrate 110 toward the interior of the semiconductor substrate 110. In other words, the isolation structures 120 are formed to be embedded in the semiconductor substrate 110. In some embodiments, the isolation structures 120 do not penetrate the semiconductor substrate 110. In some embodiment, the isolation structures 120 may, for example, be shallow trench isolation (STI) structures. The formation process of the isolation structures 120 may be attained by the following steps. First, a plurality of shallow trenches having a predetermined depth are formed in the semiconductor substrate 110 by, for example, photolithograph/etching process or other suitable patterning processes. Then, a dielectric material is deposited in the trenches. Subsequently, a portion of the dielectric material is removed (e.g., polishing, etching, or a combination thereof) to form the isolation structures 120 (i.e. the STI structures).

In some embodiments, a material of the semiconductor substrate 110 includes silicon, and a material of the isolation structures 120 (i.e. the STI structures) includes silicon oxide, silicon nitride, silicon oxynitride, other suitable materials, or a combination thereof. In some alternative embodiments, the semiconductor substrate 110 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 1, a plurality of photosensitive devices 130 are formed in the active areas defined in the semiconductor substrate 110. The photosensitive devices 130 are configured to absorb radiation incident on the photosensitive devices 130 to generate an electric signal. In some embodiments, the photosensitive devices 130 are formed through ion implantation on the first surface 110a of the semiconductor substrate 110. For example, the photosensitive devices 130 are photodiodes. Each of the photodiodes may include at least one p-type doped region, at least one n-type doped region, and a p-n junction formed between the p-type doped region and the n-type doped region. In detail, when the semiconductor substrate 110 is a p-type substrate, n-type dopants (e.g., phosphorous or arsenic) may be doped into the active areas of the semiconductor substrate 110 to form n-type wells, and the resulting p-n junctions in the active areas are able to perform the image sensing function. Similarly, when the semiconductor substrate 110 is an n-type substrate, p-type dopants (e.g., boron or $BF_2$) may be doped into the active areas of the semiconductor substrate 110 to form p-type wells, and the resulting p-n junctions in the active areas are able to perform the image sensing function. Detailed descriptions of ion implantation processes for forming n-type doped regions (wells) or p-type doped regions (wells) are omitted herein. When a reversed bias is applied to the p-n junctions of the photosensitive devices 130, the p-n junctions are sensitive to an incident light. The light received or detected by the photosensitive devices 130 is converted into photo-current such that analog signal representing intensity of the photo-current is generated. In some alternatively embodiments, the photosensitive devices 130 may be other photoelectric elements capable of performing image sensing function. For example, the photosensitive devices 130 may include a p-i-n junction, where an intrinsic semiconductor region may be arranged between and contacting the n-type doped region and the p-type doped region.

In some embodiments, one or more transistors 140 may be formed on the first surface 110a of the semiconductor substrate 110. In some embodiments, the one or more transistors 140, for example, may be transfer gate transistors configured to selectively transfer charge accumulated in the photosensitive devices 130 out of the photosensitive devices 130 for readout. In some embodiments, other transistors (not shown) may also be formed on the first surface 110a of the semiconductor substrate 110, such as source-follower transistors, row select transistors, reset transistors, or a combination thereof. In addition, a logic circuit may be formed on the semiconductor substrate 110. The logic circuit is designate for receiving and processing signal originated from the photosensitive devices 130. The logic circuit, for example, includes conductive traces and NAND/NOR gates. A material of the logic circuit may include, but not limited to, metal and polysilicon. It should be noted that the location of the logic circuit is not limited on the semiconductor substrate 110. In some alternative embodiments, the logic circuits may be fabricated on other elements (e.g., the support substrate 200 illustrated in FIG. 2) formed subsequently, and the explanations will be discussed later.

As shown in FIG. 1, an interconnection layer 150 is formed on the first surface 110a of the semiconductor substrate 110. The interconnection layer 150 is disposed on and electrically connected to the photosensitive devices 130 such that signal generated from the photosensitive devices 130 may be transmitted to other components for processing. For example, analog signal generated from the photosensitive devices 130 is transmitted by the interconnection layer 150 to other components, such as an analog-to-digital converter (ADC), for processing. In some embodiment, the interconnection layer 150 includes conductive trace layers and interlayer dielectric layers stacked alternately, but they construe no limitation in the disclosure. In some alternative embodiments, certain foregoing layers within the interconnection layer 150 may be omitted, as long as the analog signal generated from the photosensitive devices 130 are able to be transmitted to other components for processing. Suitable material for the conductive trace layers includes conductors such as metal. It is noted that the conductive trace layers may be made of a same material or different materials, and may include a single layer of metallic traces or multiple layers of metallic traces. In a scenario where multiple layers of metallic traces are found in the conductive trace layers, interlayer dielectric layers (ILD) are inserted between each metallic trace layer. A material of the ILD layer includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof.

Figure 2:
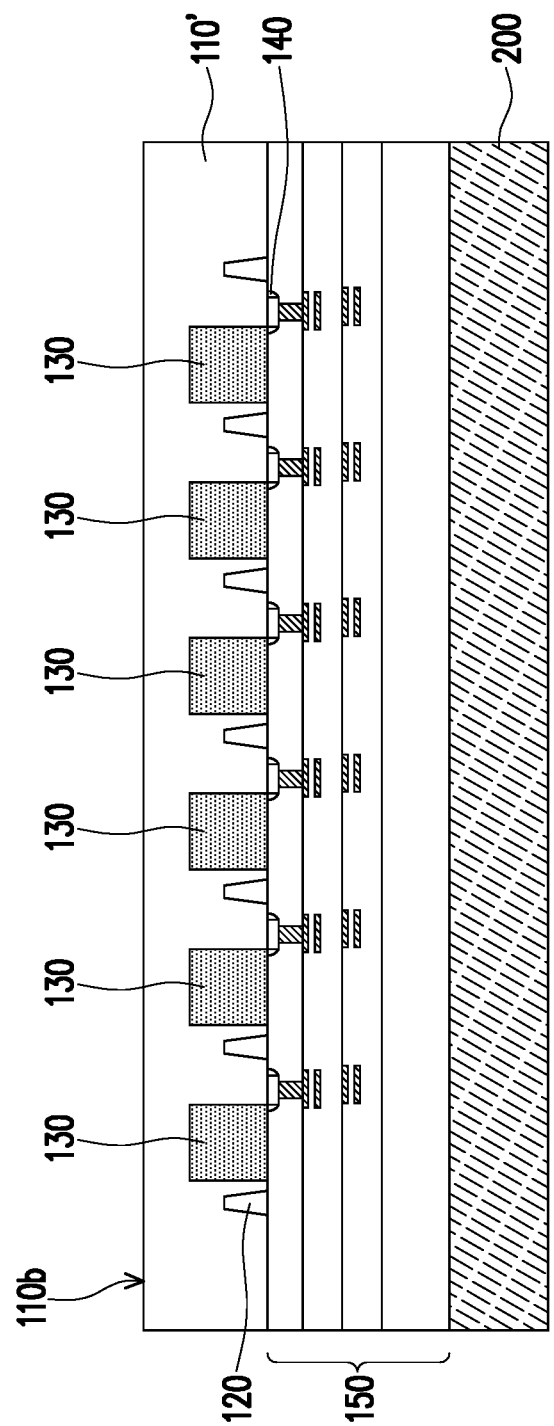

Referring to FIG. 1 and FIG. 2, the semiconductor substrate 110 having the interconnection layer 150 formed thereon may be flipped and bonded to a support substrate 200. In some embodiments, the semiconductor substrate 110 and the support substrate 200 may be silicon substrates or substrates made by other suitable materials. The material of the semiconductor substrate 110 may be the same as that of the support substrate 200. For example, the semiconductor substrate 110 and the support substrate 200 are semiconductor wafers, and a wafer level bonding process may be performed such that the semiconductor substrate 110 is flipped and the interconnection layer 150 formed on the semiconductor substrate 110 is bonded to the support substrate 200. After the semiconductor substrate 110 and the support substrate 200 are bonded, the interconnection layer 150 is between the support substrate 200 and the photosensitive devices 130. In some embodiments, the support substrate 200 may be a blank wafer for enhancing the mechanical strength of the device while serving as a protection layer. In some alternative embodiments, the support substrate 200 may include metallic traces for signal transmission. For example, as mentioned above, instead of forming the logic circuit on the semiconductor substrate 110, the logic circuit may be formed in and/or on the support substrate 200 in some embodiments.

In some embodiments, a thinning process of the semiconductor substrate 110 may be performed such that the semiconductor substrate 110 is thinned down to form a thinned semiconductor substrate 110'. In some embodiments, a back polishing process of the semiconductor substrate 110 is performed to reduce the thickness of the semiconductor substrate 110. In other words, the back surface (i.e., the second surface 110b) of the semiconductor substrate 110 which is opposite to the interconnection layer 150 is polished. For example, in some embodiments, the back polishing is achieved by chemical mechanical polishing (CMP), and in some alternative embodiments, the back polishing is attained by chemical etching. The disclosure does not construe the polishing method, as long as the semiconductor substrate 110 is polished or removed to render a desired thickness.

The support substrate 200 provides sufficient structural support (e.g., rigidity) so as to facilitate the thinning process of the semiconductor substrate 110. Due to the supporting of the support substrate 200, the photosensitive devices 130 in the thinned semiconductor substrate 110' are not damaged during the thinning process of the semiconductor substrate 110.

Figure 3:
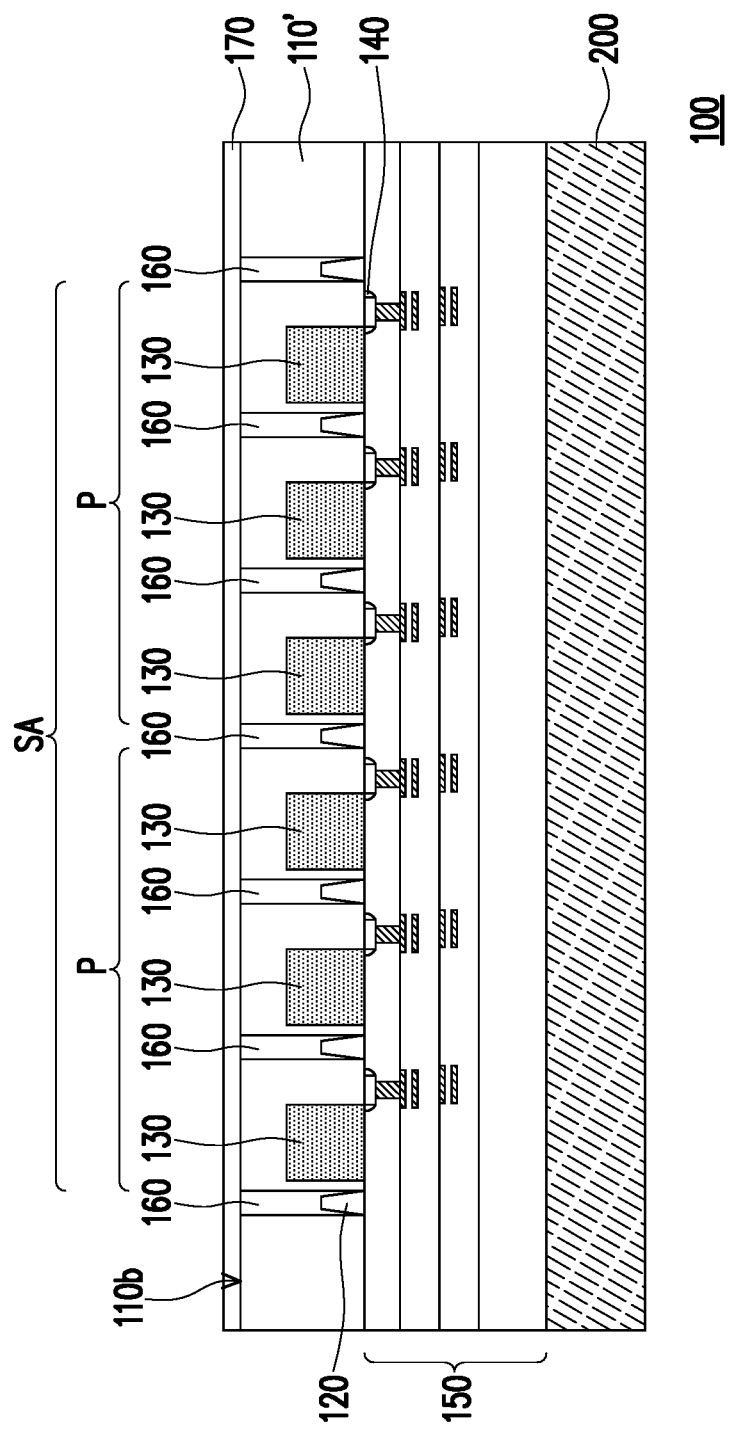

Referring to FIG. 3, in order to enhance electrical isolation in between the photosensitive devices 130 and minimize leakage, a plurality of isolation structures 160 may be formed in the thinned semiconductor substrate 100'. For example, the isolation structures 160 are deep trench isolations (DTI) structures. The aspect ratio of the isolation structures 160 may be greater than that of the isolation structures 120. The isolation structures 160 may be substantially aligned with the isolation structures 120. Processes for forming the isolation structures 160 (i.e., DTI) are similar to the formation processes of the isolation structures 120, and thus detailed descriptions of the formation processes of the isolation structures 160 are omitted here.

In some embodiments, after forming the isolation structures 160, a planarization layer 170 having a flat top surface may be formed to cover the surface 110b of the thinned semiconductor substrate 110' and the isolation structures 160. For example, the material of the planarization layer 170 includes silicon oxide or other suitable dielectric materials. In some alternative embodiments, the fabrication of the planarization layer 170 may be omitted. Furthermore, in some embodiments, a plurality of color filters (e.g., red color filters, blue color filters, green color filters, etc., not shown) may be formed on the planarization layer 170. The color filters are respectively configured to transmit specific wavelengths of incident radiation, while blocking other wavelengths of incident radiation. For example, the red color filters filtrate the incident radiation and allow red light passing through such that the red light is received by the photosensitive devices 130 located below the red color filters; the green color filters filtrate the incident radiation and allow green light passing through such that the green light is received by the photosensitive devices 130 located below the green color filters; and the blue color filters filtrate the incident radiation and allow blue light passing through such that the blue light is received by the photosensitive devices 130 located below the blue color filters. In some embodiments, the red color filters, the green color filters and the blue color filters may be formed by different photoresist materials, and the photoresist materials for forming the red color filters, the green color filters and the blue color filters may be patterned through photolithography processes, for example.

As shown in FIG. 3, an image capture chip 100 including an optical sensing area SA is illustrated. The image capture chip 100 includes a plurality of sensing pixels P arranged in array. The sensing pixels P are located within the optical sensing area SA of the image capture chip 100. Each of the sensing pixels P includes the photosensitive devices 130. It should be noted that only one image capture chip 100 is shown in FIG. 3 for illustration purpose. However, before a singulation process of the semiconductor substrate 110', a plurality of image capture chips 100 in the semiconductor substrate 110' may be connected one another.

A lens layer 300 (shown in FIG. 8) configured to direct incident radiation towards the photosensitive devices 130 is then formed on the image capture chip 100 through a series of wafer level processes. The fabrication of the lens layer 300 is described in accompany with FIG. 4 through FIG. 8 in detail.

Figure 4:
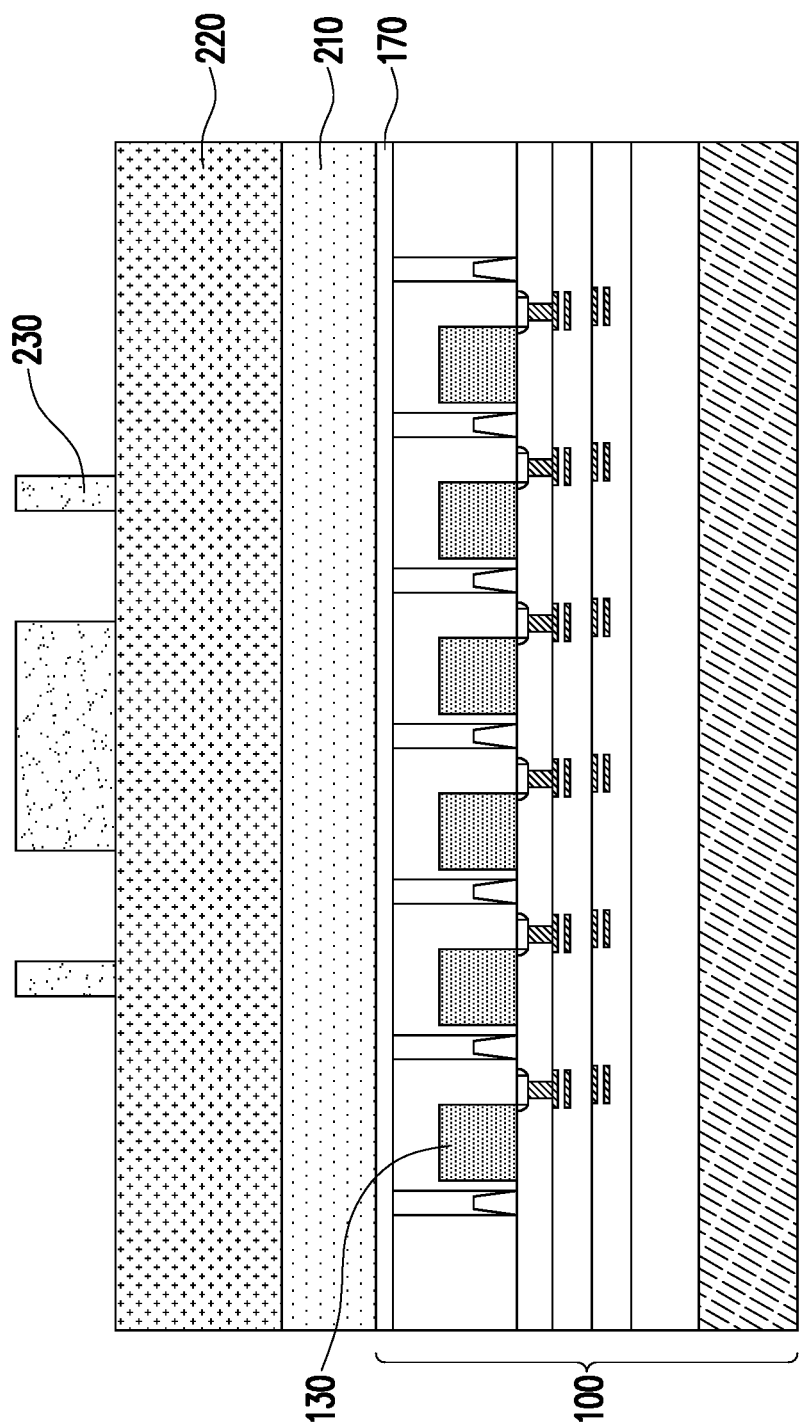

Referring to FIG. 4, a material layer 210 is formed over the planarization layer 170, a padding layer 220 (or a buffer layer) is formed over the material layer 210, and a patterned mask layer 230 is formed over the padding layer 220. In some embodiments, the material layer 210 is made of a high refractive index material. In some embodiments, the refractive index of the material layer 210 may be greater than the refractive index of the dielectric layers of the interconnection layer 150. For example, the refractive index of the material layer 210 may range from about 1.5 to about 2.5. In some embodiments, a material of the material layer 210 may be similar to or the same as that of the patterned mask layer 230, and a material of the padding layer 220 may be different from those of the material layer 210 and the patterned mask layer 230. In some embodiments, the materials of the material layer 210 and the patterned mask layer 230 may be, for example, silicon nitride ($SiN_x$), or other suitable material; and the material of the padding layer 220 may be, for example, silicon oxide, or other suitable material. However, in some alternative embodiments, the material of the material layer 210 may be different from that of the patterned mask layer 230. In some embodiments, the patterned mask layer 230 is patterned by, for example, photolithograph/etching process or other suitable patterning processes.

In some embodiments, a pattern density of the patterned mask layer 230 directly above one image capture chip 100 varies from a central region of the patterned mask layer 230 to a periphery region of the patterned mask layer 230, wherein FIG. 5A through FIG. 5D illustrate various top views of the patterned mask layer 230 of FIG. 4 according to some various embodiments of the present disclosure. The pattern density of the patterned mask layer 230 is defined as the ratio of an area of the mask patterns (e.g., light-shielding patterns) of the patterned mask layer 230 in a specific region to an area of the specific region. In some embodiments, the pattern density of the patterned mask layer 230 directly above the one image capture chip 100 linearly varies from the central region of the patterned mask layer 230 to the periphery region of the patterned mask layer 230. In some embodiments, the pattern density of the patterned mask layer 230 directly above the one image capture chip 100 non-linearly varies from the central region of the patterned mask layer 230 to the periphery region of the patterned mask layer 230.

Figure 5B:
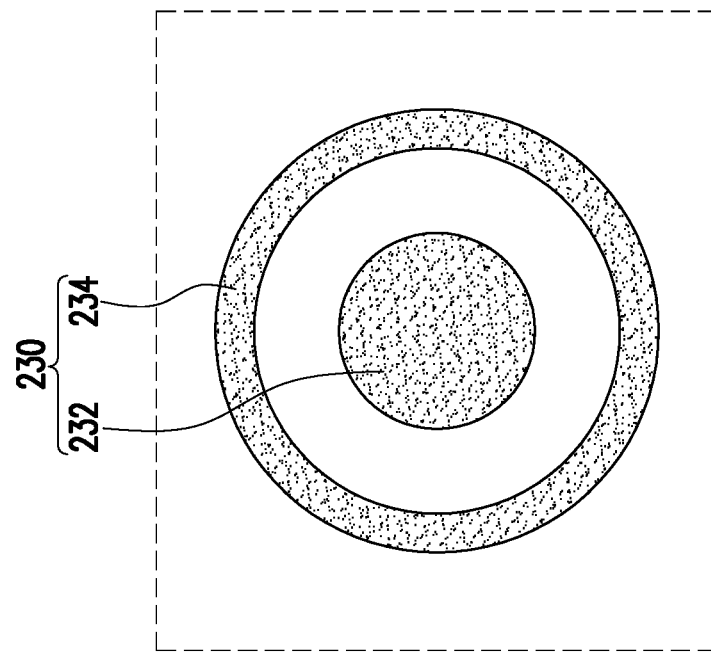
FIG. 5A through FIG. 5D illustrate various top views of the patterned mask layer of FIG. 4 according to some various embodiments of the present disclosure.
Figure 5A:
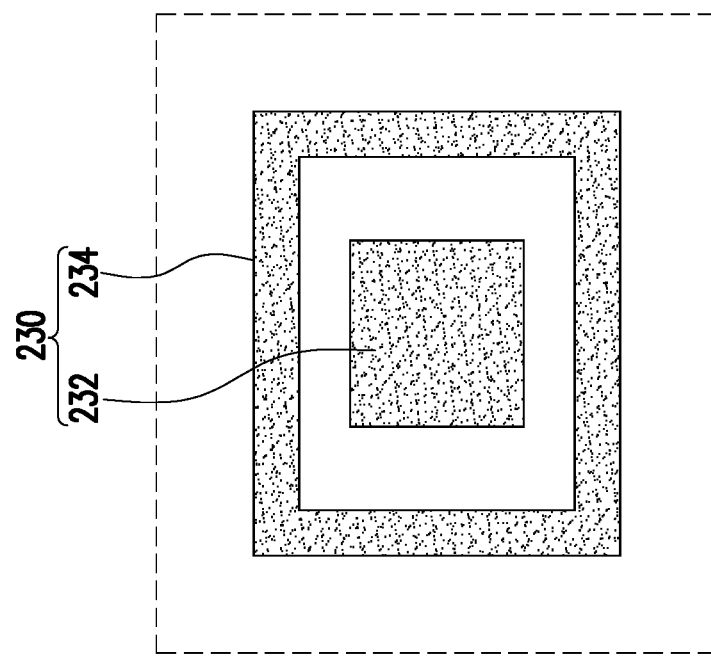
Figure 5D:
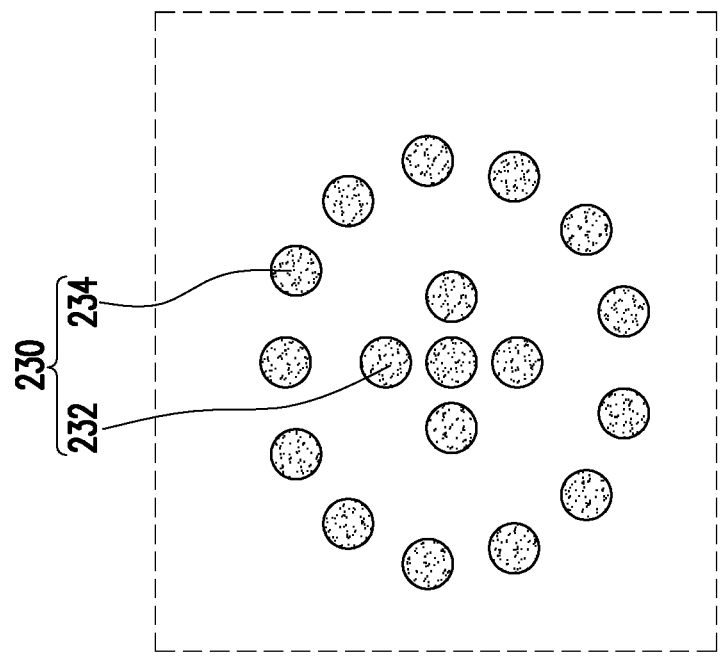
Figure 5C:
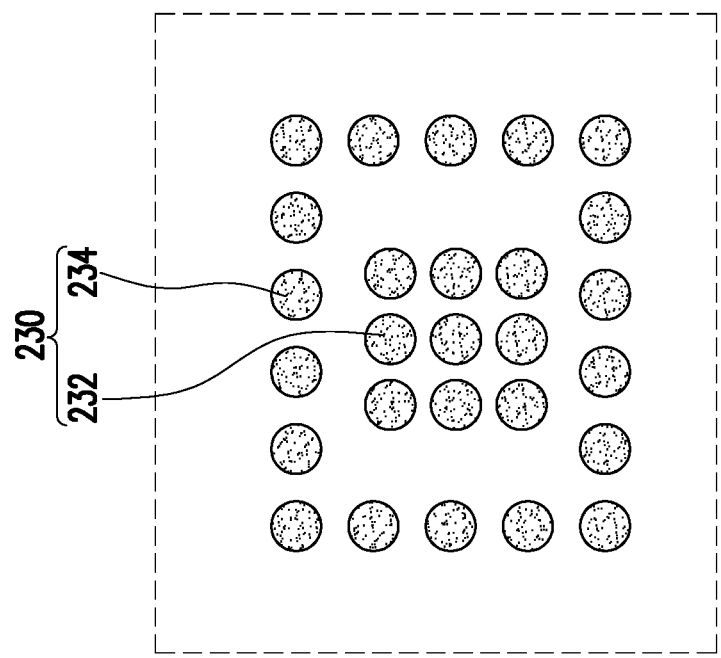

As shown in FIG. 4 and FIG. 5A through FIG. 5D, the pattern density of the patterned mask layer 230 decreases from the central region of the patterned mask layer 230 to the periphery region of the patterned mask layer 230. In other word, the patterned mask layer 230 is denser in the central region than the periphery region. In FIG. 5A, the patterned mask layer 230 may include a first mask pattern 232 and a second mask pattern 234 surrounding the first mask pattern 232. The first mask pattern 232 from the top view may be shaped as a rectangular pattern, and the second mask pattern 234 from the top view may be shaped as a rectangular-frame pattern. In some embodiments, a width of the first mask pattern 232 may be greater than that of the second mask pattern 234. In some embodiments, the patterned mask layer 230 may further include another mask pattern (not shown) surrounding the first mask pattern 232 and the second mask pattern 234, wherein a width of the another mask pattern may be less than that of the second mask pattern 234, and/or a space between the another mask pattern and the second mask pattern 234 may be wider than a space between the second mask pattern 234 and the first mask pattern 232. The disclosure does not construe the number of the mask patterns. In FIG. 5B, the patterned mask layer 230 may be similar to the patterned mask layer 230 in FIG. 5A, except that the first mask pattern 232 from the top view may be shaped as a circular pattern, and the second mask pattern 234 from the top view may be shaped as a circular-ring pattern. The disclosure does not construe the shape of the mask patterns. In FIG. 5C, the patterned mask layer 230 may be similar to the patterned mask layer 230 in FIG. 5A, except that each of the first mask pattern 232 and the second mask pattern 234 may be formed of a plurality of separated dot patterns. In FIG. 5D, the patterned mask layer 230 may be similar to the patterned mask layer 230 in FIG. 5B, except that each of the first mask pattern 232 and the second mask pattern 234 is formed of a plurality of separated dot patterns. The disclosure does not construe the patterns of the patterned mask layer 230, as long as the patterned mask layer 230 is polished to render a desired top profile, and the detail explanations will be discussed later.

Figure 6:
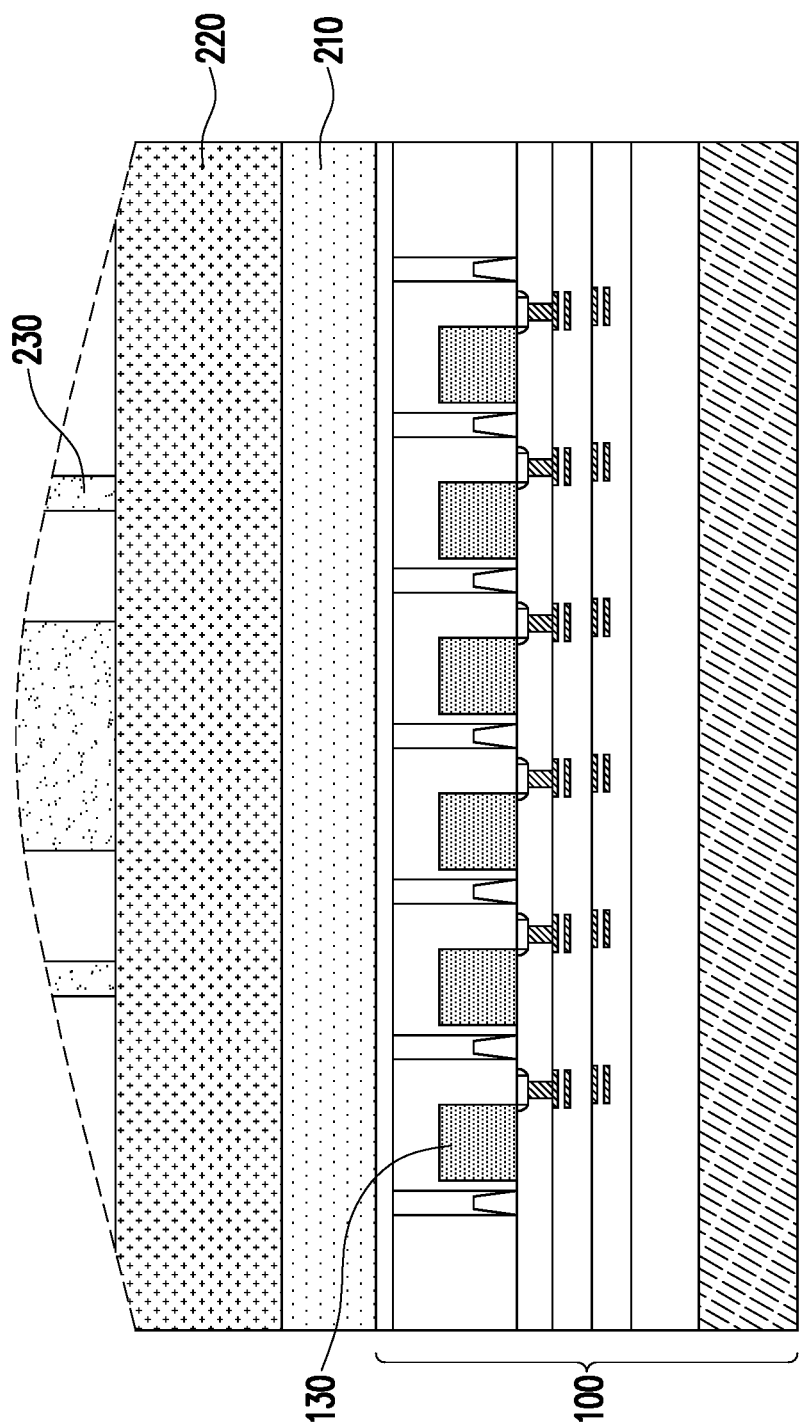
Figure 7:
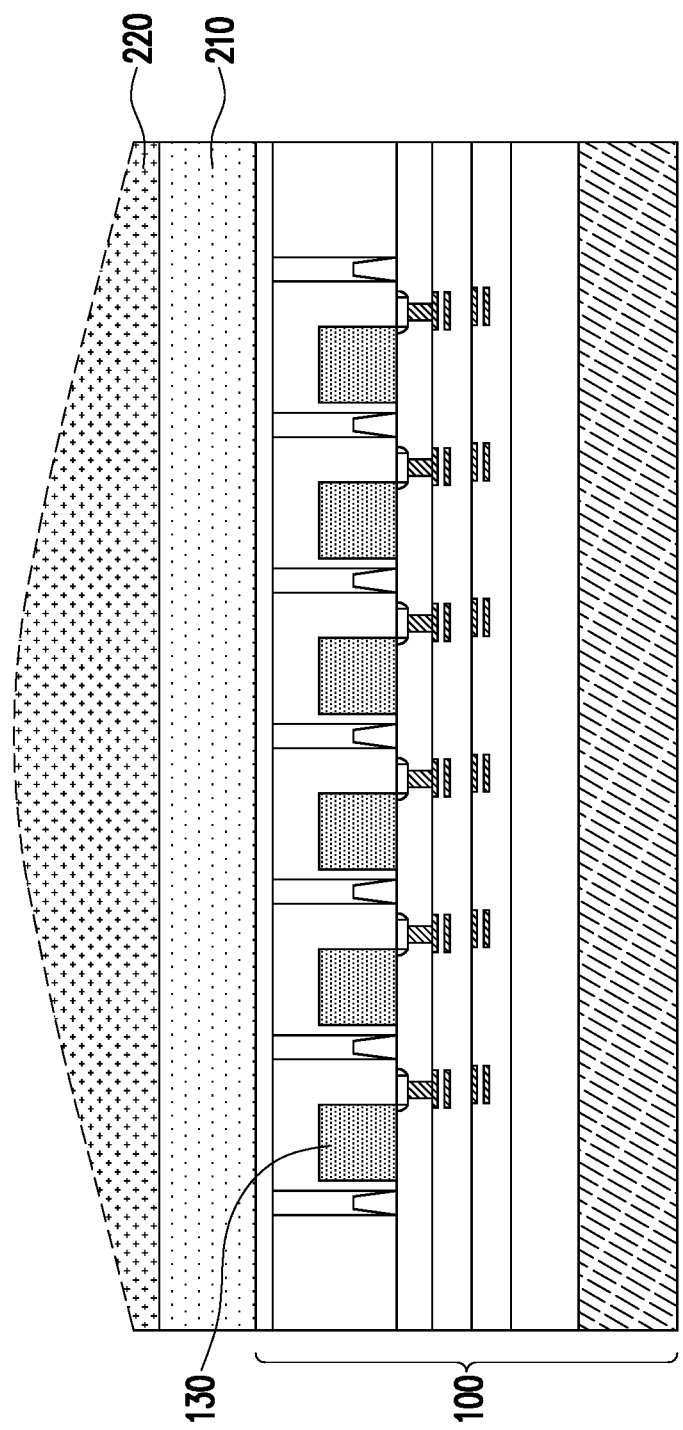
Figure 8:
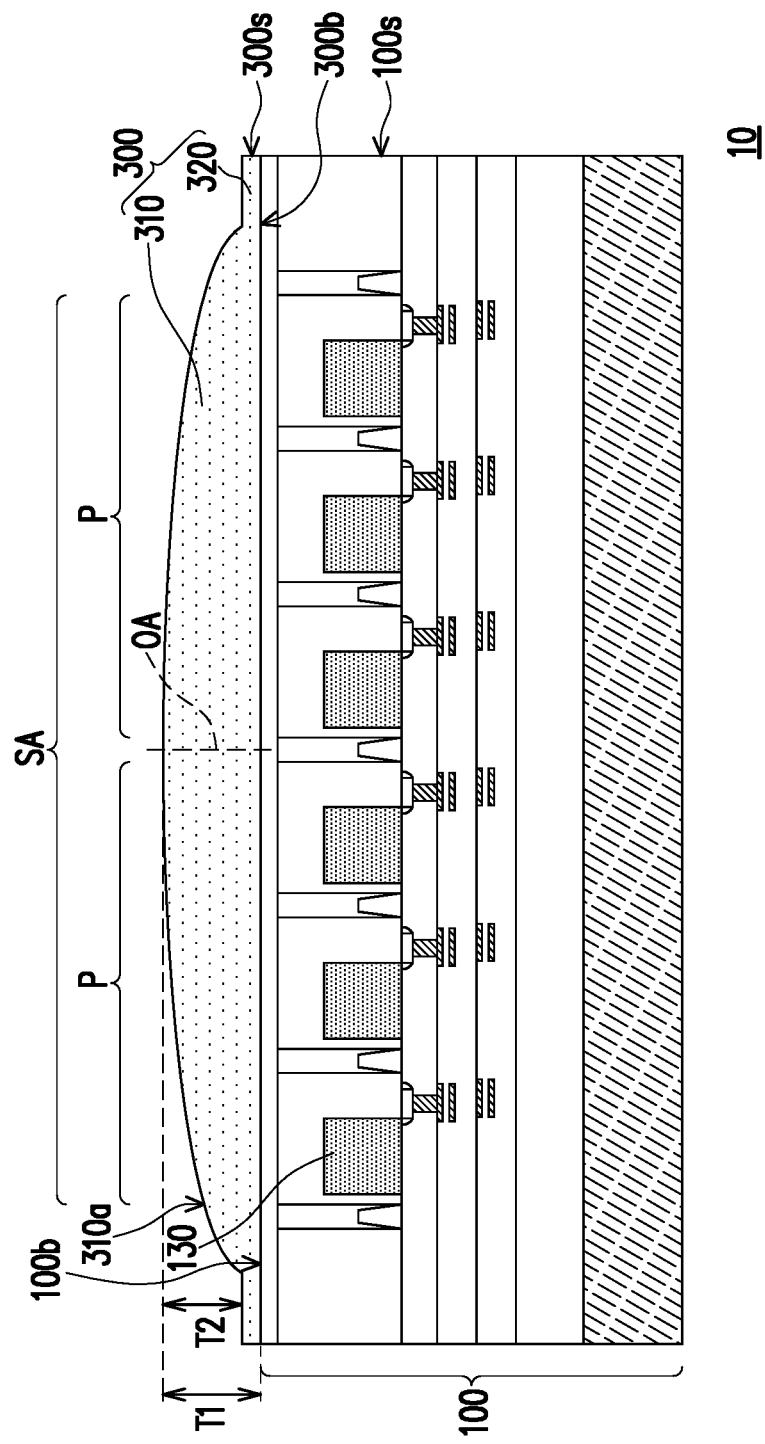
Figure 9:
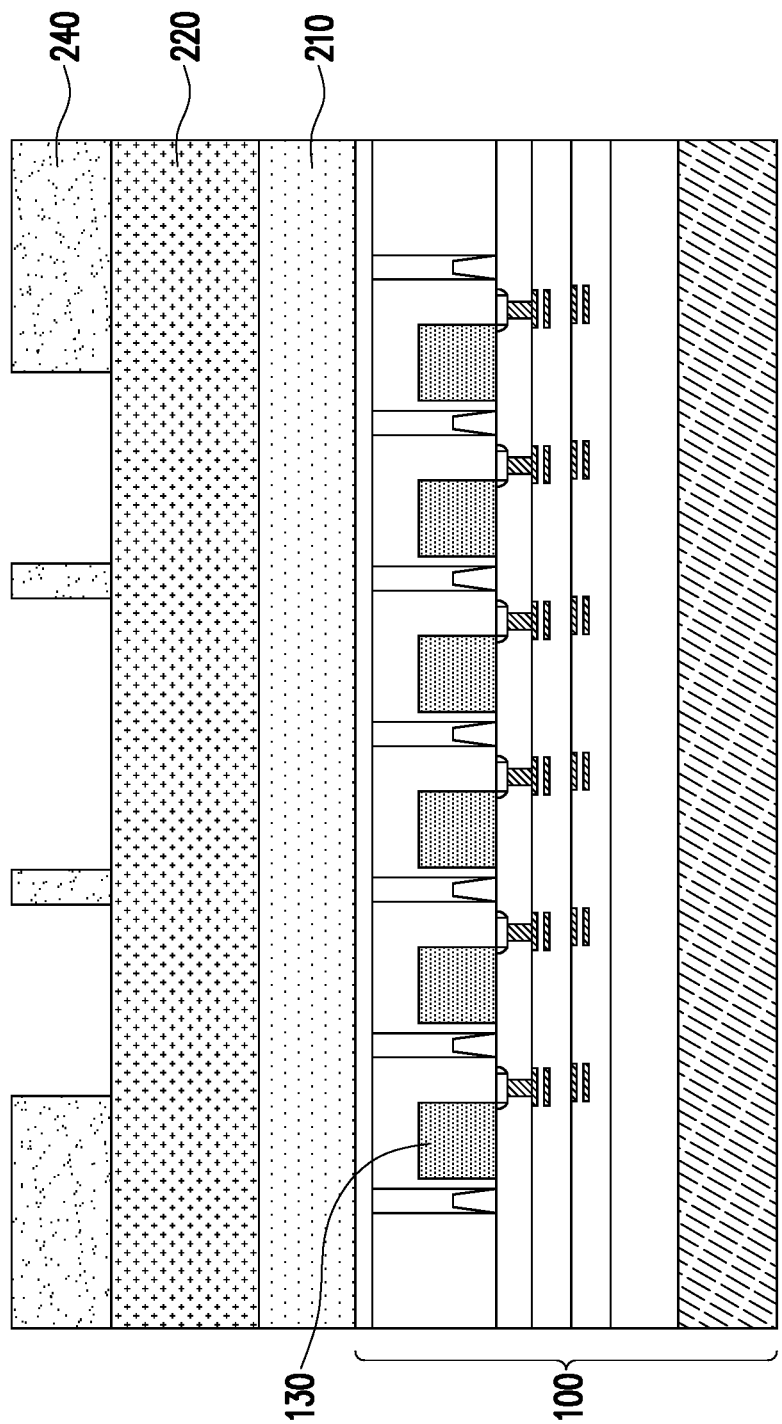
FIG. 9 to FIG. 12 are schematic cross-sectional views illustrating various stages in a manufacturing method of an image sensor according to some embodiments of the present disclosure.

Referring to FIG. 6 through FIG. 8, the patterned mask layer 230, the padding layer 220 and the material layer 210 are polished. In some embodiments, the material layer 210 is polished by using the patterned mask layer 230 as a polishing mask to form the lens layer 300 including a single lens portion 310 on the image capture chip 100. In some embodiments, the patterned mask layer 230, the padding layer 220 and the material layer 210 are polished by using the same slurry. For illustration purpose, FIG. 6 and FIG. 7 are illustrated to show intermediate views of the polishing. In some embodiments, since the pattern density of the patterned mask layer 230 varies from the central region of the patterned mask layer 230 to the periphery region of the patterned mask layer 230, the central region of the patterned mask layer 230 and the periphery region of the patterned mask layer 230 may be polished under different polishing rates due to loading effects. For example, the central region of the patterned mask layer 230 is polished slower than the periphery region of the patterned mask layer 230.

As shown in FIG. 6, the central region of the patterned mask layer 230 is polished under a first polishing rate, and the periphery region of the patterned mask layer 230 is polished under a second polishing rate greater than the first polishing rate because the pattern density of the patterned mask layer 230 decreases from the central region of the patterned mask layer 230 to the periphery region of the patterned mask layer 230. In other word, during the polishing process, the polishing rate (removal rate) of the periphery region of the patterned mask layer 230 is higher than the polishing rate (removal rate) of the central region of the patterned mask layer 230, so that the periphery region of the patterned mask layer 230 is recessed more than the central region of the patterned mask layer 230, and the top surface of the patterned mask layer 230 may become rounded and convex. Furthermore, in some embodiments, a periphery region of the padding layer 220 may be polished earlier than a central region of the padding layer 220. In some embodiments, the periphery region and the central region of the padding layer 220 may be polished under the same polishing rate. Thus, as shown in FIG. 7, when the patterned mask layer 230 is polished out, the periphery region of the padding layer 220 is also recessed more than the central region of the padding layer 220. As shown in FIG. 8, the padding layer 220 is polished out, and the lens layer 300 including the single lens portion 310 is formed on the image capture chip 100, wherein the single lens portion 310 of the lens layer 300 has a curved and convex light-incident surface 310a.

In some embodiments, the curvature of the curved and convex light-incident surface 310a of the single lens portion 310 may be determined by the pattern design of the patterned mask layer 230 as well as the polishing rate of the material layer 210, the padding layer 220 and the patterned mask layer 230. That is to say, through the pattern design of the patterned mask layer 230 and properly selecting of the material of the layers 210, 220 and 230, a predetermined curvature of the curved and convex light-incident surface 310a of the single lens portion 310 may be obtained. In some embodiments, during the polishing process, the padding layer 220 may be polished under a polishing rate which is greater than the polishing rate of the periphery region of the patterned mask layer 230 and/or the polishing rate of the central region of the patterned mask layer 230. In some embodiments, during the polishing process, the padding layer 220 may be polished under a polishing rate which is substantially equal to the polishing rate of the periphery region of the patterned mask layer 230 or the polishing rate of the central region of the patterned mask layer 230. In some embodiments, during the polishing process, the padding layer 220 may be polished under a polishing rate which is less than the polishing rate of the periphery region of the patterned mask layer 230 and/or the polishing rate of the central region of the patterned mask layer 230. For example, in some embodiments, the padding layer 220 may be polished under a polishing rate which is greater than both of the polishing rate of the periphery region of the patterned mask layer 230 and the polishing rate of the central region of the patterned mask layer 230; in some embodiments, the padding layer 220 may be polished under a polishing rate which is greater than the polishing rate of the central region of the patterned mask layer 230 and substantially equal to the polishing rate of the periphery region of the patterned mask layer 230; in some embodiments, the padding layer 220 may be polished under a polishing rate which is between the polishing rate of the periphery region of the patterned mask layer 230 and the polishing rate of the central region of the patterned mask layer 230; in some embodiments, the padding layer 220 may be polished under a polishing rate which is less than the polishing rate of the periphery region of the patterned mask layer 230 and substantially equal to the polishing rate of the central region of the patterned mask layer 230; and in some embodiments, the padding layer 220 may be polished under a polishing rate which is less than both of the polishing rate of the periphery region of the patterned mask layer 230 and the polishing rate of the central region of the patterned mask layer 230.

In some embodiments, during the polishing process, the material layer 210 may be polished under a polishing rate which is greater than the polishing rate of the padding layer 220. In some embodiments, during the polishing process, the material layer 210 may be polished under a polishing rate which is substantially equal to the polishing rate of the padding layer 220. In some embodiments, during the polishing process, the material layer 210 may be polished under a polishing rate which is less than the polishing rate of the padding layer 220.

Referring to FIG. 8, in some embodiments, after the lens layer 300 is formed by the series of wafer level processes (e.g., film deposition, film patterning, polishing, and so on), a singulation process may be performed to obtain at least one image sensor 10. In some embodiments, the singulation process may be a wafer dicing process including mechanical sawing or laser cutting. In some embodiments, after the singulation process, the fabrication process of the image sensor 10 is completed.

As shown in FIG. 8, the image sensor 10 includes the image capture chip 100 and the lens layer 300 formed on the image capture chip 100. The lens layer 300 includes the single lens portion 310 covering the optical sensing area SA of the image capture chip 100, wherein an orthogonal projection of the single lens portion 310 projecting onto the image capture chip 100 overlaps the optical sensing area SA. In other words, the single lens portion 310 is disposed over the image capture chip 100 and entirely covers the optical sensing area SA of the image capture chip 100. In some embodiments, an optical axis OA of the single lens portion 310 may be substantially aligned with a center of the optical sensing area SA. In other words, the optical axis OA of the single lens portion 310 may be substantially aligned with a center of the plurality of the pixels P. In some embodiments, sidewalls 100s of the image capture chip 100 are substantially aligned with sidewalls 300s of the lens layer 300. In other words, the lens layer 300 is a chip-scale lens formed on the image capture chip 100. In some embodiments, bottom surface 300b of the lens layer 300 may be in contact with a surface (e.g., back-side surface 100b) of the image capture chip 100.

In some embodiments, the lens layer 300 may further include a base portion 320. The single lens portion 310 is on the base portion 320 and protrudes upwardly from the base portion 320. The single lens portion 310 partially covers the base portion 320, and the base portion 320 entirely covers the image capture chip 100. In some embodiments, the base portion 320 includes the planar bottom surface 300b in contact with the surface (e.g., back-side surface 100b) of the image capture chip 100 and the sidewalls 300s substantially aligned with sidewalls 100s of the image capture chip 100. However, in some alternative embodiments, the lens layer 300 may not include the base portion 320, and the single lens portion 310 may entirely cover the image capture chip 100 as well as include the planar bottom surface 300b in contact with the surface (e.g., back-side surface 100b) of the image capture chip 100 and the sidewalls 300s substantially aligned with sidewalls 100s of the image capture chip 100. In this case, as the lens layer 300 only includes the single lens portion 310 and does not include the base portion 320, a maximum thickness T1 of the lens layer 300 is substantially equal to a maximum thickness T2 of the single lens portion 310. In some embodiments, the maximum thickness T1 of the lens layer 300 may range from about 1 micrometer to about 100 micrometers. In some embodiments, the maximum thickness T2 of the single lens portion 310 may range from about 1 micrometer to about 100 micrometers.

As shown in FIG. 8, the lens layer 300 is formed on and in contact with the back-side surface 100b of the image capture chip 100. In other words, the image sensor 10 in FIG. 8 is a back-side illuminated (BSI) image sensor capable of capturing the incident light from the back-side surface. However, in some alternative embodiments, the image sensor 10 may be a front-side illuminated (FSI) image sensor capable of capturing the incident light from the front-side surface, and the lens layer 300 may be formed on and in contact with a front-side surface of the image capture chip 100.

Since the lens layer 300 is formed directly on and in contact with the image capture chip 100, in some embodiments, an external lens module which is thicker than the image capture chip 100 is not required to be assembled on the image capture chip 100. In some embodiments, the single lens portion 310 of the lens layer 300 may partially or entirely replace the above-mentioned external lens module, and the manufacturing process of the image sensor 10 may be simplified. The manufacturing cost may be lower. Furthermore, the image sensor 10 may be more compact.

Figure 10:
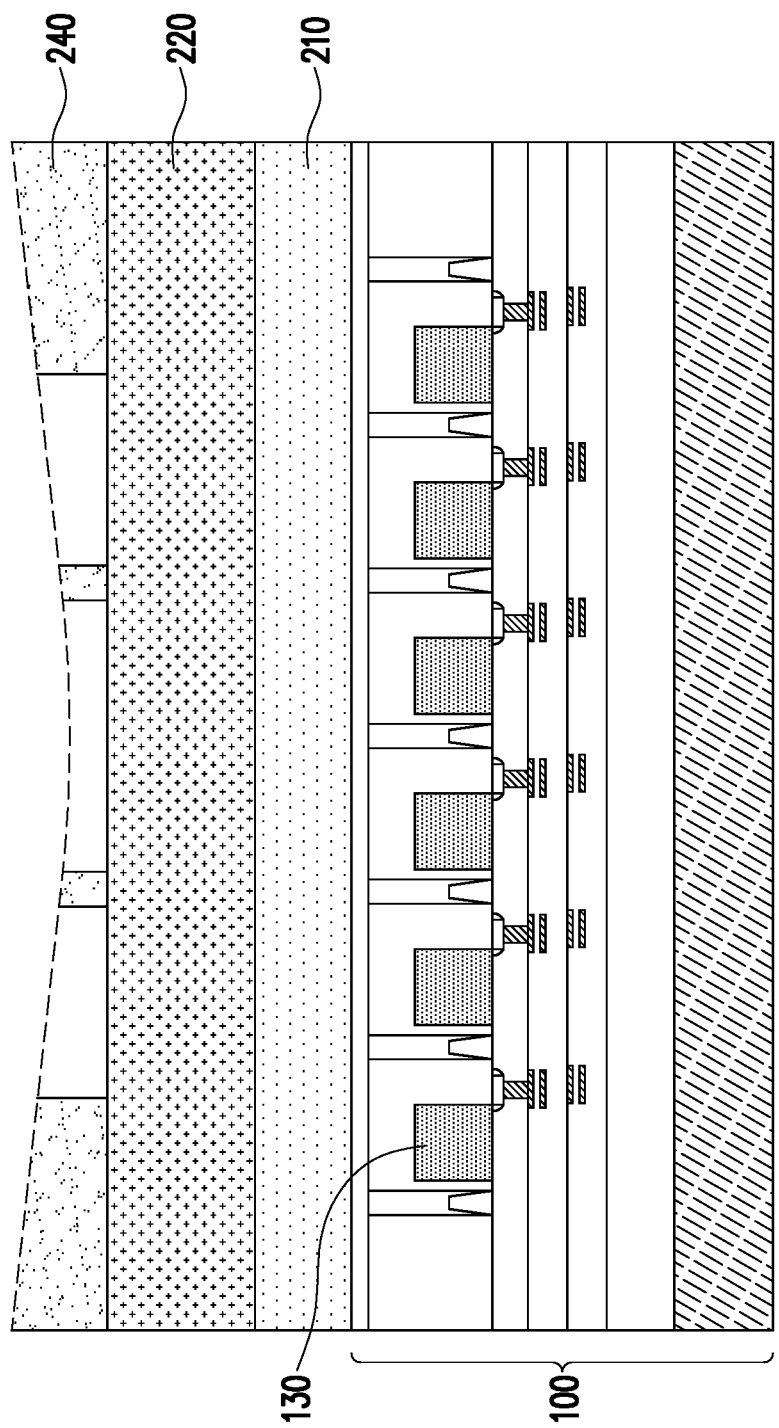
Figure 11:
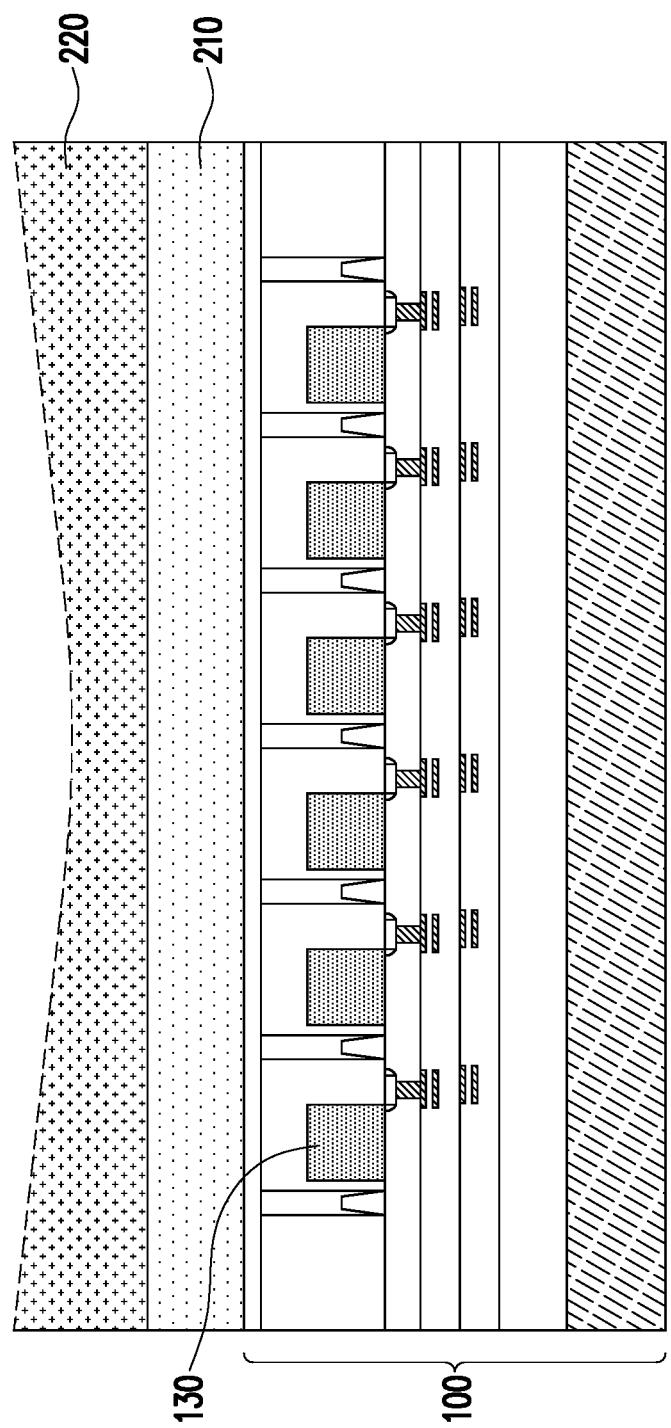
Figure 12:
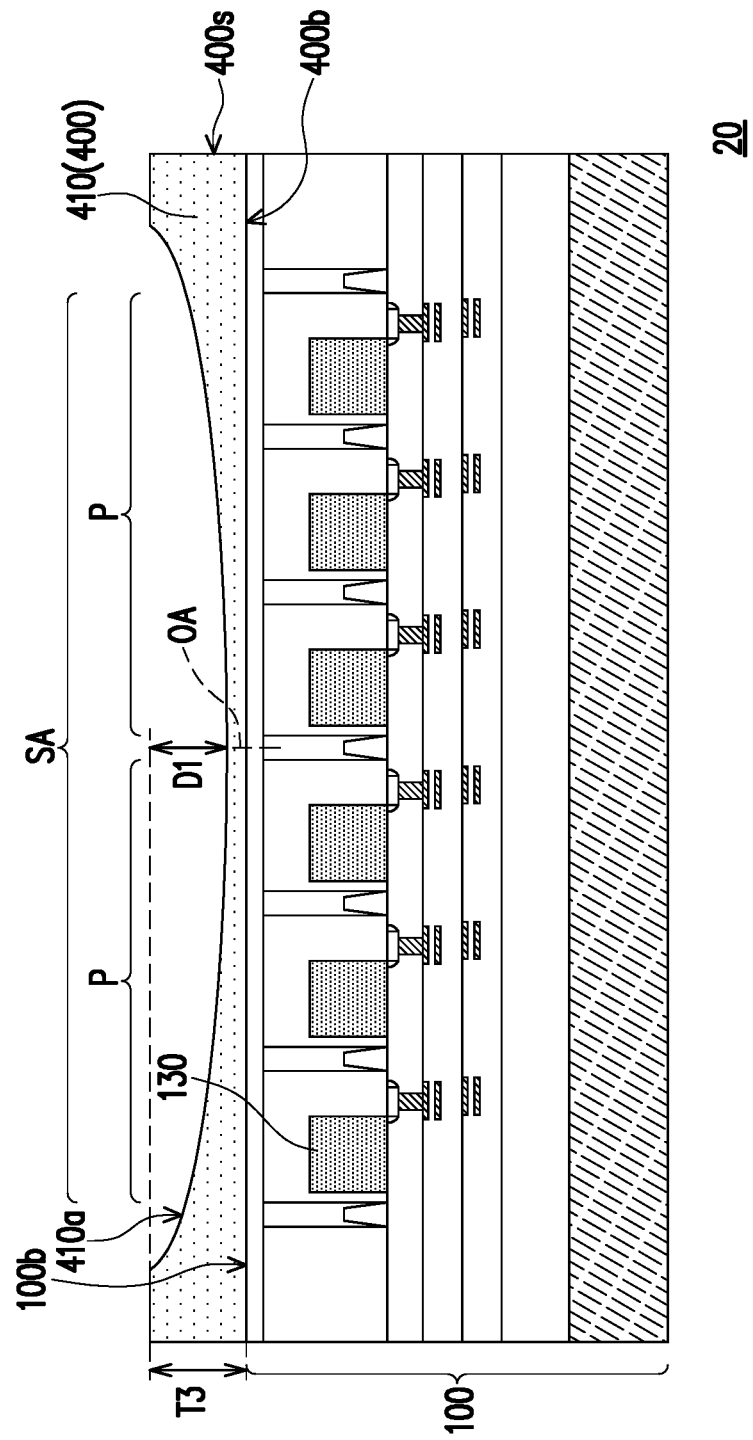

FIG. 9 through FIG. 12 are schematic cross-sectional views illustrating various stages in a manufacturing method of an image sensor according to some embodiments of the present disclosure. The manufacturing method of an image sensor 20 illustrated in the FIG. 9 through FIG. 12 is similar to the manufacturing method of the image sensor 10 illustrated in the FIG. 1 through FIG. 8. Thus, some detailed descriptions thereof are omitted here. A difference therebetween lies in that the pattern density of the patterned mask layer 240 increases from the central region of the patterned mask layer 240 to the periphery region of the patterned mask layer 240 in FIG. 9. In other word, the patterned mask layer 240 is denser in the periphery region than the central region. Therefore, a single lens portion 410 of a lens layer 400 has a curved and concave light-incident surface 410a as shown in FIG. 12.

Referring to FIG. 10 through FIG. 12, the patterned mask layer 240, the padding layer 220 and the material layer 210 are polished. In some embodiments, the material layer 210 is polished by using the patterned mask layer 240 as a polishing mask to form the lens layer 400 including the single lens portion 410 on the image capture chip 100. In some embodiments, the patterned mask layer 240, the padding layer 220 and the material layer 210 are polished by using the same slurry. For illustration purpose, FIG. 10 and FIG. 11 are illustrated to show intermediate views of the polishing. For example, the central region of the patterned mask layer 240 is polished faster than the periphery region of the patterned mask layer 240.

As shown in FIG. 10, the central region of the patterned mask layer 240 is polished under a first polishing rate, and the periphery region of the patterned mask layer 240 is polished under a second polishing rate less than the first polishing rate because the pattern density of the patterned mask layer 240 increases from the central region of the patterned mask layer 240 to the periphery region of the patterned mask layer 240. In other word, during the polishing process, the polishing rate (removal rate) of the periphery region of the patterned mask layer 240 is lower than the polishing rate (removal rate) of the central region of the patterned mask layer 240, so that the central region of the patterned mask layer 240 is recessed more than the periphery region of the patterned mask layer 240, and the top surface of the patterned mask layer 240 may become rounded and concave. Furthermore, in some embodiments, a central region of the padding layer 220 may be polished earlier than a periphery region of the padding layer 220. In some embodiments, the periphery region and the central region of the padding layer 220 may be polished under the same polishing rate. Thus, as shown in FIG. 11, when the patterned mask layer 240 is polished out, the central region of the padding layer 220 is also recessed more than the periphery region of the padding layer 220. As shown in FIG. 12, the padding layer 220 is polished out, and the lens layer 400 including the single lens portion 410 is formed on the image capture chip 100, wherein the single lens portion 410 of the lens layer 400 has a curved and concave light-incident surface 410a.

In some embodiments, the padding layer 220 may be polished under a polishing rate which is greater than both of the polishing rate of the periphery region of the patterned mask layer 240 and the polishing rate of the central region of the patterned mask layer 240; in some embodiments, the padding layer 220 may be polished under a polishing rate which is greater than the polishing rate of the periphery region of the patterned mask layer 240 and substantially equal to the polishing rate of the central region of the patterned mask layer 240; in some embodiments, the padding layer 220 may be polished under a polishing rate which is between the polishing rate of the periphery region of the patterned mask layer 240 and the polishing rate of the central region of the patterned mask layer 240; in some embodiments, the padding layer 220 may be polished under a polishing rate which is less than the polishing rate of the central region of the patterned mask layer 240 and substantially equal to the polishing rate of the periphery region of the patterned mask layer 240; and in some embodiments, the padding layer 220 may be polished under a polishing rate which is less than both of the polishing rate of the periphery region of the patterned mask layer 240 and the polishing rate of the central region of the patterned mask layer 240.

As shown in FIG. 12, the image sensor 20 includes the image capture chip 100 and the lens layer 400 formed on the image capture chip 100. The lens layer 400 includes the single lens portion 410 covering the optical sensing area SA of the image capture chip 100, wherein an orthogonal projection of the single lens portion 410 projecting onto the image capture chip 100 overlaps the optical sensing area SA. In other words, the single lens portion 410 is disposed over the image capture chip 100 and entirely covers the optical sensing area SA of the image capture chip 100. In some embodiments, an optical axis OA of the single lens portion 410 may be substantially aligned with a center of the optical sensing area SA. In other words, the optical axis OA of the single lens portion 410 may be substantially aligned with a center of the plurality of the pixels P. In some embodiments, sidewalls 100s of the image capture chip 100 are substantially aligned with sidewalls 400s of the lens layer 400. In other words, the lens layer 400 is a chip-scale lens formed on the image capture chip 100. In some embodiments, bottom surface 400b of the lens layer 400 may be in contact with a surface (e.g., back-side surface 100b) of the image capture chip 100.

In some embodiments, the single lens portion 410 may entirely cover the image capture chip 100 as well as include the planar bottom surface 400b in contact with the surface (e.g., back-side surface 100b) of the image capture chip 100 and the sidewalls 400s substantially aligned with sidewalls 100s of the image capture chip 100. In some embodiments, a maximum thickness T3 of the lens layer 400 may range from about 1 micrometer to about 100 micrometers. In some embodiments, a maximum distance D1 between the topmost surface of the lens layer 400 and the curved and concave light-incident surface 410a may range from about 0.5 micrometer to about 95 micrometers. In some embodiments, the maximum thickness T3 of the lens layer 400 is greater than the maximum distance D1 between the topmost surface of the lens layer 400 and the curved and concave light-incident surface 410a.

Since the lens layer 400 is formed directly on and in contact with the image capture chip 100, in some embodiments, an external lens module which is thicker than the image capture chip 100 is not required to be assembled on the image capture chip 100. In some embodiments, the single lens portion 410 of the lens layer 400 may partially or entirely replace the above-mentioned external lens module, and the manufacturing process of the image sensor 10 may be simplified. The manufacturing cost may be lower. Furthermore, the image sensor 10 may be more compact.

Figure 13:
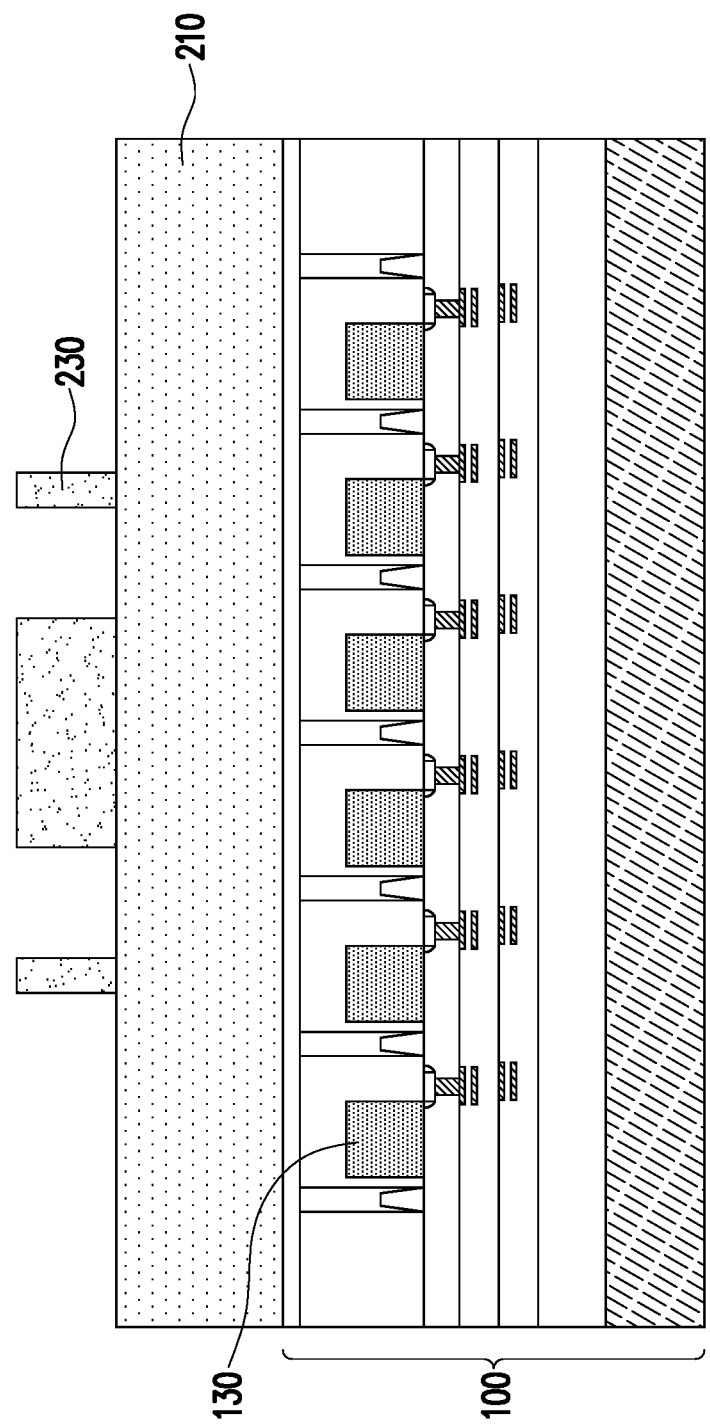
FIG. 13 to FIG. 15 are schematic cross-sectional views illustrating various stages in a manufacturing method of an image sensor according to some embodiments of the present disclosure.
Figure 14:
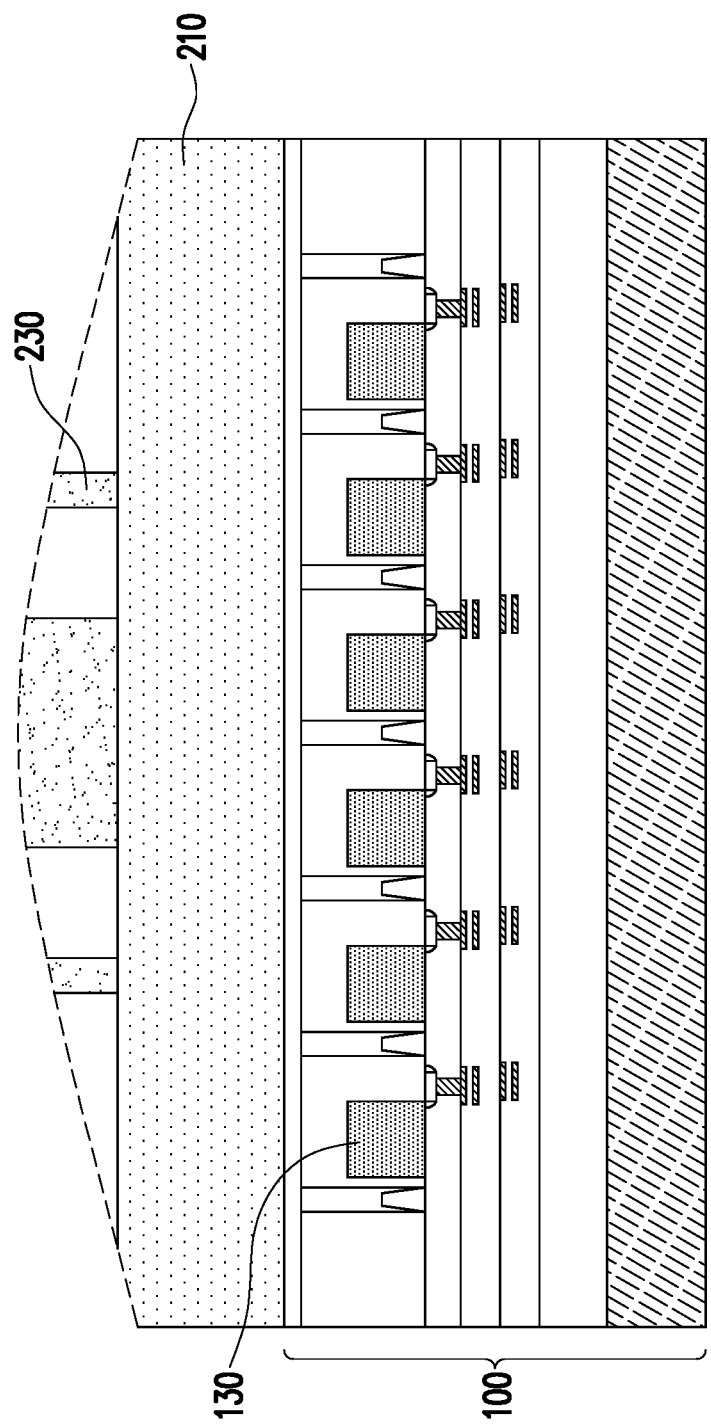
Figure 15:
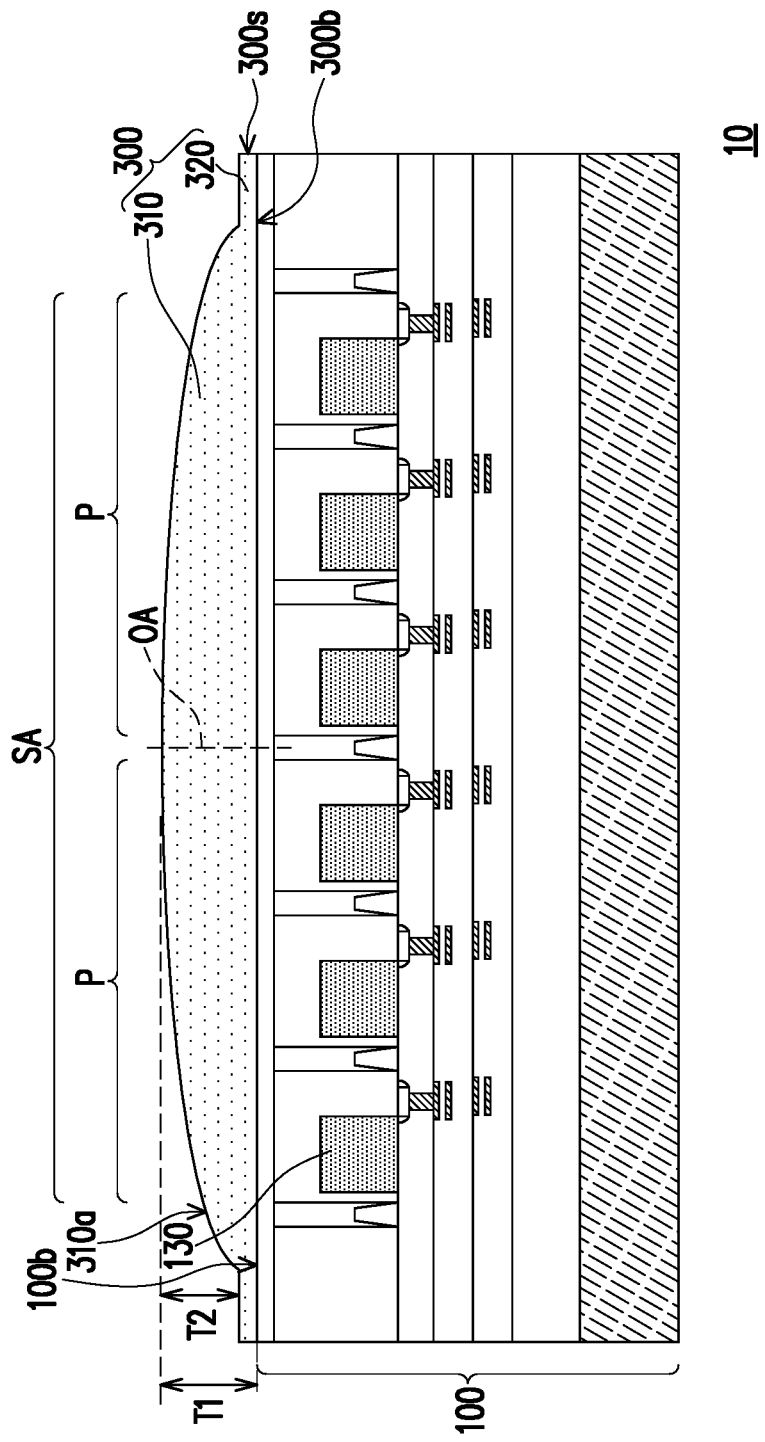

FIG. 13 through FIG. 15 are schematic cross-sectional views illustrating various stages in a manufacturing method of an image sensor according to some embodiments of the present disclosure. The manufacturing method of the image sensor 10 illustrated in the FIG. 13 through FIG. 15 is similar to the manufacturing method of the image sensor 10 illustrated in the FIG. 1 through FIG. 8. Thus, some detailed descriptions thereof are omitted here. A difference therebetween lies in that the material of the patterned mask layer 230 is different from that of the material layer 210, and thus the padding layer 220 is omitted in FIG. 13.

Referring to FIG. 14 through FIG. 15, the patterned mask layer 230 and the material layer 210 are polished. In some embodiments, the material layer 210 is polished by using the patterned mask layer 230 as a polishing mask to form the lens layer 300 including the single lens portion 310 on the image capture chip 100. In some embodiments, the patterned mask layer 230 and the material layer 210 are polished by using the same slurry. For illustration purpose, FIG. 14 is illustrated to show an intermediate view of the polishing. For example, the central region of the patterned mask layer 230 is polished slower than the periphery region of the patterned mask layer 230.

As shown in FIG. 14, the central region of the patterned mask layer 230 is polished under a first polishing rate, and the periphery region of the patterned mask layer 230 is polished under a second polishing rate greater than the first polishing rate because the pattern density of the patterned mask layer 230 decreases from the central region of the patterned mask layer 230 to the periphery region of the patterned mask layer 230. In other word, during the polishing process, the polishing rate (removal rate) of the periphery region of the patterned mask layer 230 is higher than the polishing rate (removal rate) of the central region of the patterned mask layer 230, so that the periphery region of the patterned mask layer 230 is recessed more than the central region of the patterned mask layer 230, and the top surface of the patterned mask layer 230 may become rounded and convex. Furthermore, in some embodiments, a periphery region of the material layer 210 may be polished earlier than a central region of the material layer 210. In some embodiments, the periphery region and the central region of the material layer 210 may be polished under the same polishing rate. Thus, as shown in FIG. 15, when the patterned mask layer 230 is polished out, the periphery region of the material layer 210 is also recessed more than the central region of the padding layer 220, and the lens layer 300 including the single lens portion 310 is formed on the image capture chip 100, wherein the single lens portion 310 of the lens layer 300 has a curved and concave light-incident surface 310a.

In some embodiments, during the polishing process, the material layer 210 may be polished under a polishing rate which is greater than the polishing rate of the periphery region of the patterned mask layer 230 and/or the polishing rate of the central region of the patterned mask layer 230. In some embodiments, during the polishing process, the material layer 210 may be polished under a polishing rate which is substantially equal to the polishing rate of the periphery region of the patterned mask layer 230 or the polishing rate of the central region of the patterned mask layer 230. In some embodiments, during the polishing process, the material layer 210 may be polished under a polishing rate which is less than the polishing rate of the periphery region of the patterned mask layer 230 and/or the polishing rate of the central region of the patterned mask layer 230. For example, in some embodiments, the material layer 210 may be polished under a polishing rate which is greater than both of the polishing rate of the periphery region of the patterned mask layer 230 and the polishing rate of the central region of the patterned mask layer 230; in some embodiments, the material layer 210 may be polished under a polishing rate which is greater than the polishing rate of the central region of the patterned mask layer 230 and substantially equal to the polishing rate of the periphery region of the patterned mask layer 230; in some embodiments, the material layer 210 may be polished under a polishing rate which is between the polishing rate of the periphery region of the patterned mask layer 230 and the polishing rate of the central region of the patterned mask layer 230; in some embodiments, the material layer 210 may be polished under a polishing rate which is less than the polishing rate of the periphery region of the patterned mask layer 230 and substantially equal to the polishing rate of the central region of the patterned mask layer 230; and in some embodiments, the material layer 210 may be polished under a polishing rate which is less than both of the polishing rate of the periphery region of the patterned mask layer 230 and the polishing rate of the central region of the patterned mask layer 230.

Figure 16:
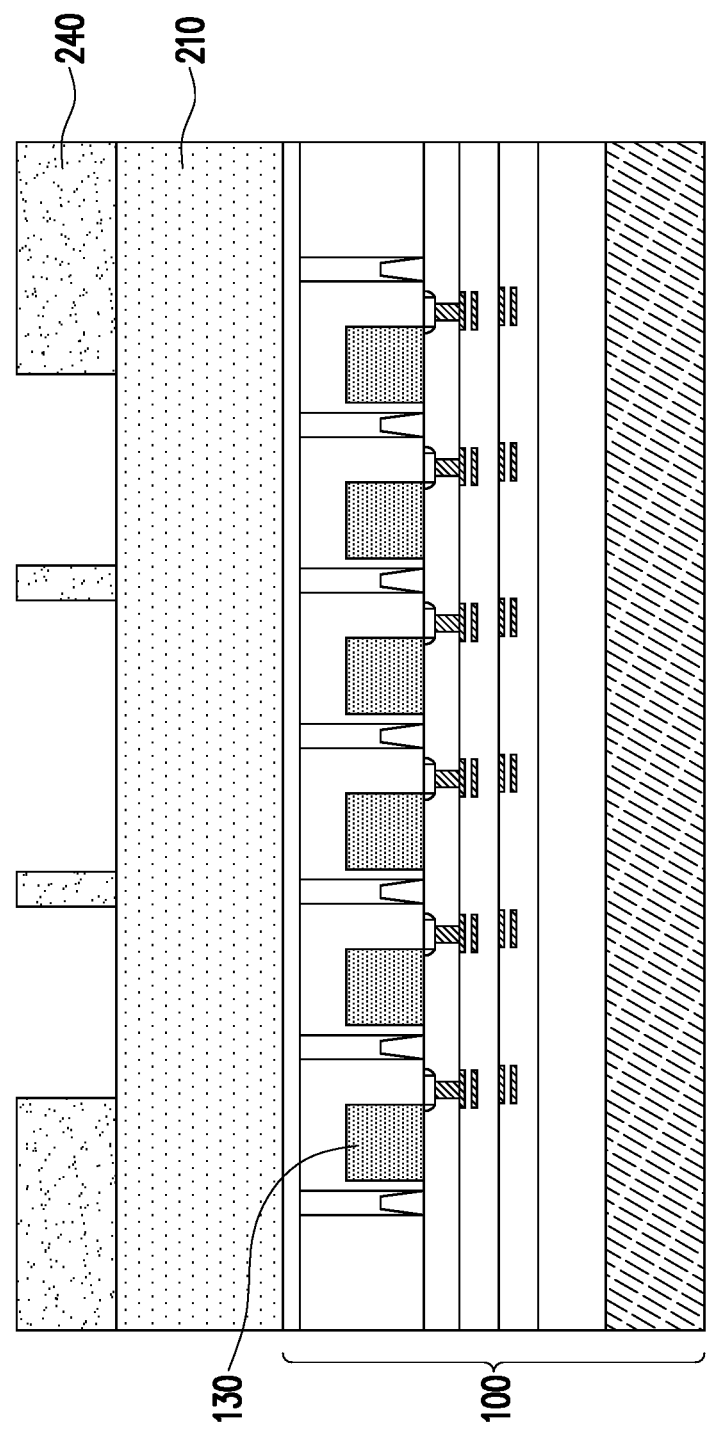
FIG. 16 to FIG. 18 are schematic cross-sectional views illustrating various stages in a manufacturing method of an image sensor according to some embodiments of the present disclosure.
Figure 17:
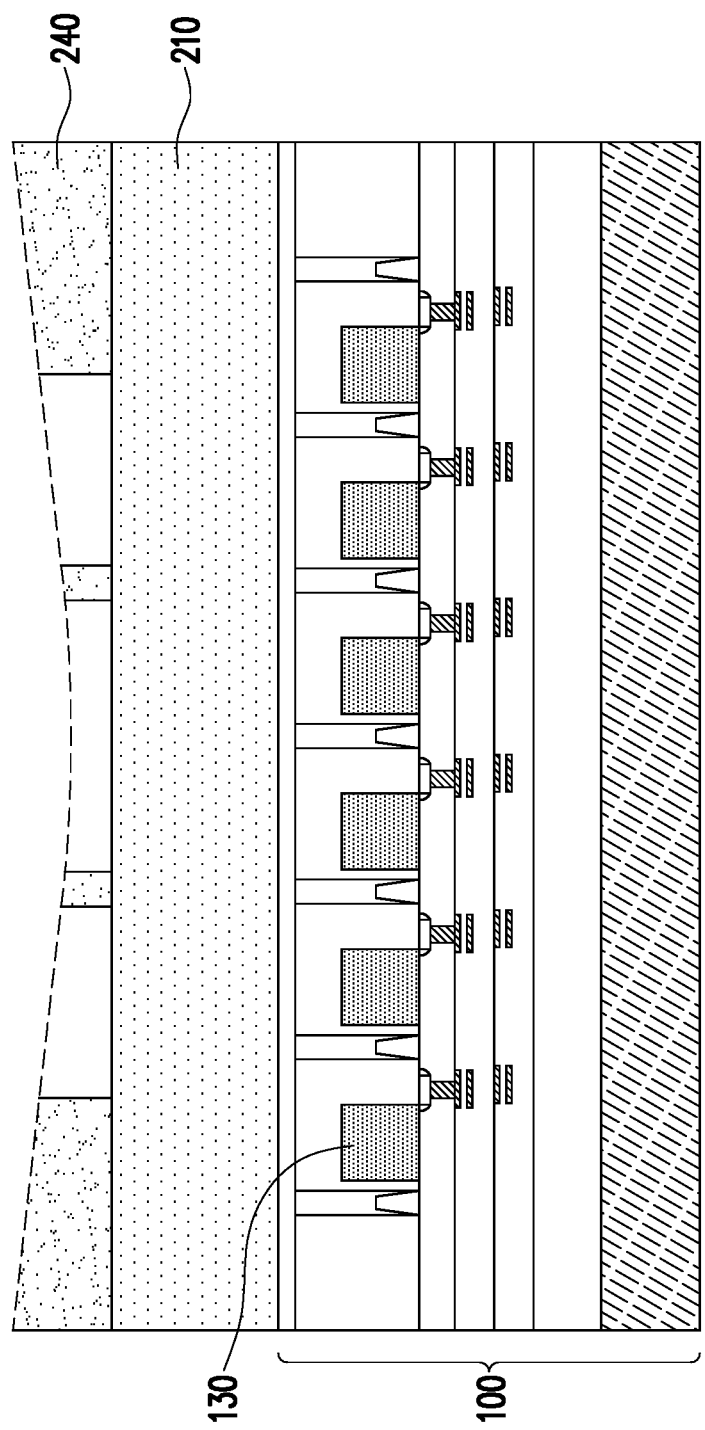
Figure 18:
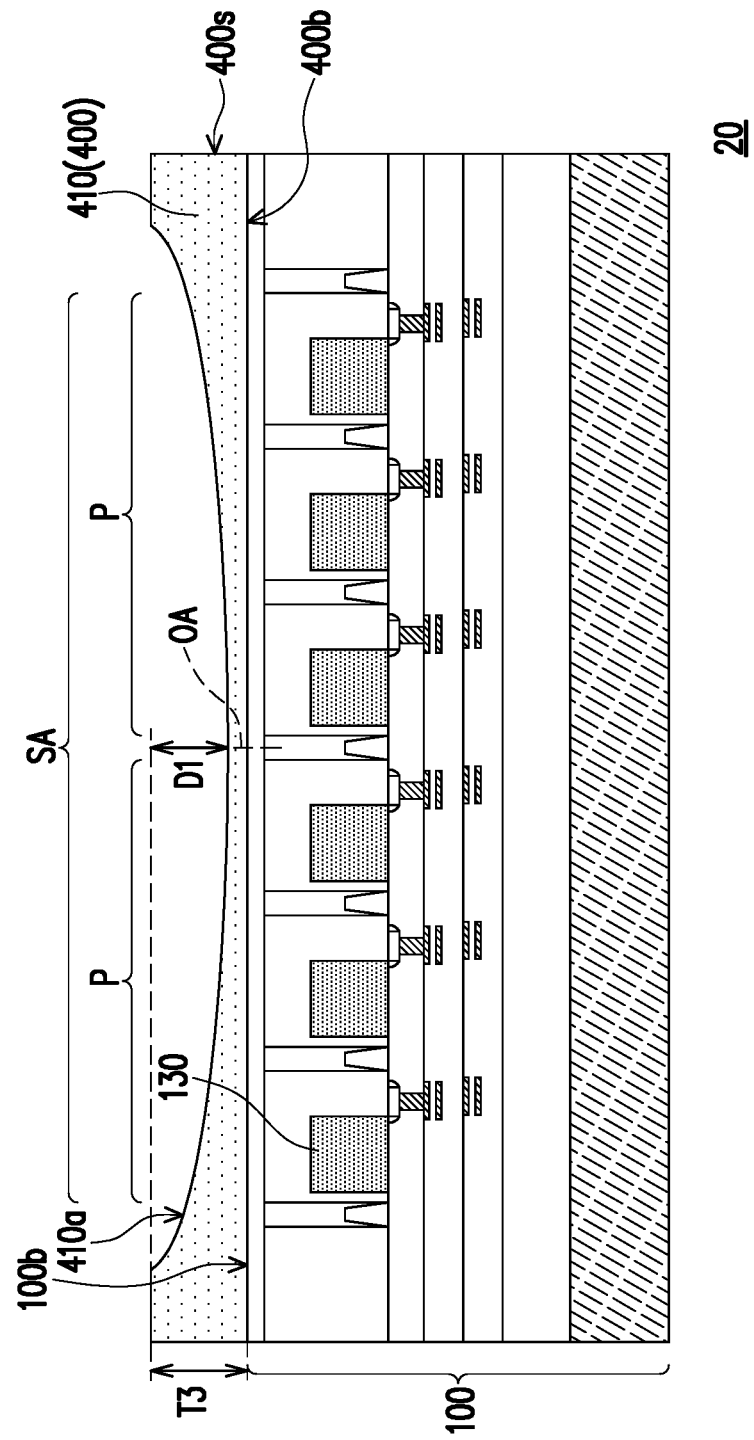

FIG. 16 through FIG. 18 are schematic cross-sectional views illustrating various stages in a manufacturing method of an image sensor according to some embodiments of the present disclosure. The manufacturing method of the image sensor 20 illustrated in the FIG. 16 through FIG. 18 is similar to the manufacturing method of the image sensor 20 illustrated in the FIG. 9 through FIG. 12. Thus, some detailed descriptions thereof are omitted here. A difference therebetween lies in that the material of the patterned mask layer 240 is different from that of the material layer 210, and thus the padding layer 220 is omitted in FIG. 16.

Referring to FIG. 17 through FIG. 18, the patterned mask layer 240 and the material layer 210 are polished. In some embodiments, the material layer 210 is polished by using the patterned mask layer 240 as a polishing mask to form the lens layer 400 including the single lens portion 410 on the image capture chip 100. In some embodiments, the patterned mask layer 240 and the material layer 210 are polished by using the same slurry. For illustration purpose, FIG. 17 is illustrated to show an intermediate view of the polishing. For example, the central region of the patterned mask layer 240 is polished faster than the periphery region of the patterned mask layer 240.

As shown in FIG. 17, the central region of the patterned mask layer 240 is polished under a first polishing rate, and the periphery region of the patterned mask layer 240 is polished under a second polishing rate less than the first polishing rate because the pattern density of the patterned mask layer 240 increases from the central region of the patterned mask layer 240 to the periphery region of the patterned mask layer 240. In other word, during the polishing process, the polishing rate (removal rate) of the periphery region of the patterned mask layer 240 is lower than the polishing rate (removal rate) of the central region of the patterned mask layer 240, so that the central region of the patterned mask layer 240 is recessed more than the periphery region of the patterned mask layer 240, and the top surface of the patterned mask layer 240 may become rounded and concave. Furthermore, in some embodiments, a central region of the material layer 210 may be polished earlier than a periphery region of the material layer 210. In some embodiments, the periphery region and the central region of the material layer 210 may be polished under the same polishing rate. Thus, as shown in FIG. 17, when the patterned mask layer 240 is polished out, the central region of the material layer 210 is also recessed more than the periphery region of the material layer 210, and the lens layer 400 including the single lens portion 410 is formed on the image capture chip 100, wherein the single lens portion 410 of the lens layer 400 has a curved and concave light-incident surface 410a.

In some embodiments, during the polishing process, the material layer 210 may be polished under a polishing rate greater than the polishing rate of the periphery region of the patterned mask layer 240 and/or the polishing rate of the central region of the patterned mask layer 240. In some embodiments, during the polishing process, the material layer 210 may be polished under a polishing rate substantially equal to the polishing rate of the periphery region of the patterned mask layer 240 or the polishing rate of the central region of the patterned mask layer 240. In some embodiments, during the polishing process, the material layer 210 may be polished under a polishing rate less than the polishing rate of the periphery region of the patterned mask layer 240 and/or the polishing rate of the central region of the patterned mask layer 240. For example, in some embodiments, the material layer 210 may be polished under a polishing rate which is greater than both of the polishing rate of the periphery region of the patterned mask layer 240 and the polishing rate of the central region of the patterned mask layer 240; in some embodiments, the material layer 210 may be polished under a polishing rate which is greater than the polishing rate of the periphery region of the patterned mask layer 240 and substantially equal to the polishing rate of the central region of the patterned mask layer 240; in some embodiments, the material layer 210 may be polished under a polishing rate which is between the polishing rate of the periphery region of the patterned mask layer 240 and the polishing rate of the central region of the patterned mask layer 240; in some embodiments, the material layer 210 may be polished under a polishing rate which is less than the polishing rate of the central region of the patterned mask layer 240 and substantially equal to the polishing rate of the periphery region of the patterned mask layer 240; and in some embodiments, the material layer 210 may be polished under a polishing rate which is less than both of the polishing rate of the periphery region of the patterned mask layer 240 and the polishing rate of the central region of the patterned mask layer 240.

In the above-mentioned embodiments, since the lens layer 300 (or lens layer 400) is formed directly on and in contact with the image capture chip 100, in some embodiments, an external lens module which is thicker than the image capture chip 100 is not required to be assembled on the image capture chip 100. In some embodiments, the single lens portion 310 of the lens layer 300 (or the single lens portion 410 of lens layer 400) may partially or entirely replace the above-mentioned external lens module, and the manufacturing process of the image sensor 10 (or image sensor 20) may be simplified. The manufacturing cost may be lower. Furthermore, the image sensor 10 (or image sensor 20) may be more compact.

In accordance with some embodiments of the disclosure, a method includes at least the following steps. A material layer is formed over an image capture chip. A patterned mask layer is formed on the material layer, wherein a pattern density of the patterned mask layer varies from a central region of the patterned mask layer to a periphery region of the patterned mask layer. The material layer is polished by using the patterned mask layer as a mask to form a lens layer including a single lens portion on the image capture chip.

In accordance with some embodiments of the disclosure, a method includes at least the following steps. A material layer is formed over an image capture chip. A patterned mask layer is formed on the material layer. The patterned mask layer and the material layer are polished to form a lens layer including a single lens portion on the image capture chip, wherein a central region of the patterned mask layer and a periphery region of the patterned mask layer are polished under different polishing rates.

In accordance with some alternative embodiments of the disclosure, an image sensor includes an image capture chip and a lens layer. The image capture chip includes an optical sensing area. The lens layer includes a single lens portion. The single lens portion covers the optical sensing area of the image capture chip, an orthogonal projection of the single lens portion projecting onto the image capture chip overlaps the optical sensing area, and an optical axis of the single lens portion is substantially aligned with a center of the optical sensing area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a material layer over an image capture chip;
   forming a padding layer on the material layer;
   forming a patterned mask layer on the material layer, the padding layer being disposed between the material layer and the patterned mask layer, wherein a pattern density of the patterned mask layer varies from a central region of the patterned mask layer to a periphery region of the patterned mask layer; and
   polishing the material layer by using the patterned mask layer as a mask to form a lens layer comprising a single lens portion on the image capture chip, wherein the padding layer and the patterned mask layer are removed during the polishing of the material layer.

2. The method according to claim 1, wherein the pattern density of the patterned mask layer decreases from the central region of the patterned mask layer to the periphery region of the patterned mask layer.

3. The method according to claim 1, wherein the pattern density of the patterned mask layer increases from the central region of the patterned mask layer to the periphery region of the patterned mask layer.

4. The method according to claim 1, wherein during the polishing of the material layer, the central region of the patterned mask layer is polished under a first polishing rate, and the periphery region of the patterned mask layer is polished under a second polishing rate greater than the first polishing rate.

5. The method according to claim 1, wherein during the polishing of the material layer, the central region of the patterned mask layer is polished under a first polishing rate, and the periphery region of the patterned mask layer is polished under a second polishing rate less than the first polishing rate.

6. The method according to claim 1, wherein during the polishing of the material layer, the central region of the patterned mask layer is polished under a first polishing rate, the periphery region of the patterned mask layer is polished under a second polishing rate, and the padding layer is polished under a third polishing rate greater than the first polishing rate or the second polishing rate.

7. The method according to claim 1, wherein during the polishing of the material layer, the central region of the patterned mask layer is polished under a first polishing rate, the periphery region of the patterned mask layer is polished under a second polishing rate, and the padding layer is polished under a third polishing rate less than the first polishing rate or the second polishing rate.

8. The method according to claim 1, wherein during the polishing of the material layer, the central region of the patterned mask layer is polished under a first polishing rate, the periphery region of the patterned mask layer is polished under a second polishing rate, and the padding layer is polished under a third polishing rate substantially equal to the first polishing rate or the second polishing rate.

9. A method, comprising:
   forming a material layer over an image capture chip;
   forming a padding layer on the material layer;
   forming a patterned mask layer on the material layer, the padding layer being disposed between the material layer and the patterned mask layer; and
   polishing the patterned mask layer, the padding layer and the material layer to form a lens layer comprising a single lens portion on the image capture chip, wherein a central region of the patterned mask layer and a periphery region of the patterned mask layer are polished under different polishing rates, and the padding layer and the patterned mask layer are polished out during the polishing of the patterned mask layer, the padding layer and the material layer.

10. The method according to claim 9, wherein the central region of the patterned mask layer is polished under a first polishing rate, and the periphery region of the patterned mask layer is polished under a second polishing rate greater than the first polishing rate.

11. The method according to claim 9, wherein the central region of the patterned mask layer is polished under a first polishing rate, and the periphery region of the patterned mask layer is polished under a second polishing rate less than the first polishing rate.

12. The method according to claim 9, wherein during the polishing of the patterned mask layer and the material layer, the padding layer is polished under a third polishing rate, and the material layer is polished under a fourth polishing rate greater than the third polishing rate.

13. The method according to claim 9, wherein during the polishing of the patterned mask layer and the material layer, the padding layer is polished under a third polishing rate, and the material layer is polished under a fourth polishing rate less than the third polishing rate.

14. The method according to claim 9, wherein during the polishing of the patterned mask layer and the material layer, the padding layer is polished under a third polishing rate, and the material layer is polished under a fourth polishing rate substantially equal to the third polishing rate.

15. An image sensor, comprising:
   an image capture chip having an optical sensing area comprising a plurality of sensing pixels arranged in an array within the optical sensing area; and
   a lens layer comprising a single lens portion, the single lens portion entirely covering the optical sensing area of the image capture chip, an orthogonal projection of the single lens portion projecting onto the image capture chip overlapping the optical sensing area, and an optical axis of the single lens portion being substantially aligned with a center of the optical sensing area, wherein the lens layer comprises a top surface and a planar bottom surface opposite to the top surface, and the planar bottom surface is entirely in contact with a surface of the image capture chip,
   wherein in a vertical projection along a stacking direction of the image capture chip and the lens layer, a lateral width of the planar bottom surface is substantially equal to or greater than a lateral width of the top surface.

16. The image sensor according to claim 15, wherein sidewalls of the image capture chip are substantially aligned with sidewalls of the lens layer.

17. The image sensor according to claim 15, wherein the lens layer further comprises a base portion, the single lens portion is on the base portion, and the base portion comprises the planar bottom surface being in contact with the surface of the image capture chip.

18. The image sensor according to claim 17, wherein the base portion entirely covers the image capture chip, and sidewalls of the base portion are substantially aligned with sidewalls of the image capture chip.

19. The image sensor according to claim 15, wherein the single lens portion comprises the planar bottom surface being in contact with the surface of the image capture chip.

20. The image sensor according to claim 19, wherein the single lens portion entirely covers the image capture chip, and sidewalls of the single lens portion are substantially aligned with sidewalls of the image capture chip.

* * * * *